US012740161B2

(12) United States Patent
Baik

(10) Patent No.: US 12,740,161 B2
(45) Date of Patent: Sep. 15, 2026

(54) SCHOTTKY BARRIER PHOTODETECTOR

(71) Applicant: SAMSUNG ELECTRONICS CO., LTD., Suwon-si (KR)

(72) Inventor: Chanwook Baik, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 487 days.

(21) Appl. No.: 18/211,873

(22) Filed: Jun. 20, 2023

(65) Prior Publication Data

US 2024/0243215 A1 Jul. 18, 2024

(30) Foreign Application Priority Data

Jan. 16, 2023 (KR) ........................ 10-2023-0006309

(51) Int. Cl.
*H10F 30/227* (2025.01)
*H10F 77/12* (2025.01)
*H10F 39/18* (2025.01)

(52) U.S. Cl.
CPC ........... *H10F 30/227* (2025.01); *H10F 77/12* (2025.01); *H10F 39/182* (2025.01)

(58) Field of Classification Search
CPC ...... H10F 30/227; H10F 77/12; H10F 77/148; H10F 39/182; H10F 39/18
See application file for complete search history.

(56) References Cited

U.S. PATENT DOCUMENTS

| | | | | |
|---|---|---|---|---|
| 11,721,782 B2 | 8/2023 | Yu et al. | | |
| 2010/0078679 A1* | 4/2010 | Miyoshi | ................ | H10F 30/227 257/E31.019 |
| 2016/0156882 A1* | 6/2016 | Nam | .................... | H04N 25/131 348/280 |
| 2023/0128236 A1 | 4/2023 | Baik | | |

FOREIGN PATENT DOCUMENTS

| | | | | |
|---|---|---|---|---|
| CN | 114497266 A * | 5/2022 | ........... | H10F 71/138 |
| KR | 10-0822703 B1 | 4/2008 | | |
| KR | 10-2019599 B1 | 9/2019 | | |
| KR | 10-2306947 B1 | 9/2021 | | |
| KR | 10-2023-0057769 A | 5/2023 | | |
| WO | 2018/023192 A1 | 2/2018 | | |

OTHER PUBLICATIONS

Y.-K. Lin and J.-G. Hwu, "Photosensing by Edge Schottky Barrier Height Modulation Induced by Lateral Diffusion Current in MOS(p) Photodiode," in IEEE Transactions on Electron Devices, vol. 61, No. 9, pp. 3217-3222, Sep. 2014, doi: 10.1109/TED.2014.2334704 (Year: 2014).*

(Continued)

*Primary Examiner* — Sitaramarao S Yechuri
(74) *Attorney, Agent, or Firm* — Sughrue Mion, PLLC

(57) ABSTRACT

A photodetector, including: a semiconductor layer, a conductive layer forming a Schottky junction with the semiconductor layer, and a tunneling barrier layer between the semiconductor layer and the conductive layer, wherein the tunneling barrier layer may be configured to block a dark current between the semiconductor layer and the conductive layer.

16 Claims, 17 Drawing Sheets

(56) References Cited

OTHER PUBLICATIONS

Mayersen, "Intel demos the 400G, a 400Gbps transceiver for the datacenter", Techspot, Apr. 13, 2019, 3 total pages, https://www.techspot.com/news/79640-intel-demos-400g-400gbps-transceiver-datacenter.html.
Angelini, "Intel sees bright future for silicon photonics, moving information at light speed in datacenters and beyond", VentureBeat, May 24, 2021, 9 total pages, https://venturebeat.com/2021/05/24/intel-sees-bright-future-for-silicon-photonics-moving-information-at-light-speed-in-datacenters-and-beyond/.
Klamkin et al., "Indium Phosphide Photonic Integrated Circuits: Technology and Applications", 2018 IEEE Bicmos and Compound Semiconductor Integrated Circuits and Technology Symposium (BCICTS), 2018, pp. 8-13, doi: 10.1109/BCICTS.2018.8550947.
Piels et al., "Photodetectors for silicon photonic integrated circuits", Photodetectors: Materials, Devices and Applications, 2016, 20 total pages, doi: 10.1016/B978-1-78242-445-1.00001-4.
Chen et al., "Ultraviolet, visible, and infared response of PtSi Schottky-barrier detectors operated in the front-illuminated mode", IEEE Transactions on Electron Devices, May 31, 1991, pp. 1094-1103, vol. 38, doi:10.1109/16.78384.
Duran et al., "Schottky-Barrier Photodiode Internal Quantum Efficiency Dependence on Nickel Silicide Film Thickness", IEEE Photonics Journal, Feb. 2019, 16 total pages, vol. 11, doi:10.1109/JPHOT.2018.2886556, ISSN:1943-0655.
Avasthi et al., "Hole-blocking titanium-oxide/silicon heterojunction and its application to photovoltaics", Applied Physics Letters, May 21, 2013, 5 total pages, vol. 102, doi: 10.1063/1.4803446.
Nagamatsu et al., "Titanium dioxide/silicon hole-blocking selective contact to enable double-heterojunction crystalline silicon-based solar cell", Applied Physics Letters, Mar. 26, 2015, 6 total pages, vol. 106, doi:10.1063/1.4916540.
Duran, "Silicon-Based Infrared Photodetectors for Low-Cost Imaging Applications", Doctoral dissertation, University of Dayton, May 2019, 199 total pages.

* cited by examiner

SCHOTTKY BARRIER PHOTODETECTOR

CROSS-REFERENCE TO RELATED APPLICATION

This application is based on and claims priority under 35 U.S.C. § 119 to Korean Patent Application No. 10-2023-0006309, filed on Jan. 16, 2023, in the Korean Intellectual Property Office, the disclosure of which is incorporated by reference herein in its entirety.

BACKGROUND

1. Field

The disclosure relates to a Schottky barrier photodetector.

2. Description of the Related Art

Some photodetectors may use a silicon-based P-N junction technology which operates in the visible light band. Because silicon has a high light absorption rate in the visible light band, excellent linearity of photocurrent, high quantum efficiency (up to 80%), and low noise, and is associated with low costs, such a structure has been used in various types of complementary metal oxide semiconductor (CMOS) image sensors. Photodiodes using the P-N junction of silicon may not absorb photons having energy lower than bandgap energy of silicon, for example up to 1.12 electron volts (eV). Accordingly, silicon diodes or silicon CMOS image sensors using the same may be used in cameras for visible light, for example light having a wavelength of about 400 nanometers (nm) to about 700 nm.

Because light absorption in silicon rarely occurs in near-infrared (NIR) or short-wavelength infrared (SWIR), materials having low bandgap energy, such as Ge or InGaAs, may be used. However, because such materials are difficult to grow or synthesize and are particularly difficult to form on a silicon substrate, the development of such materials has been limited to highly expensive or particular products.

SUMMARY

Provided is a photodetector capable of sensing light having a wide wavelength band.

Provided is a photodetector capable of reducing or preventing a dark current.

Additional aspects will be set forth in part in the description which follows and, in part, will be apparent from the description, or may be learned by practice of the presented embodiments of the disclosure.

In accordance with an aspect of the disclosure, a photodetector includes a semiconductor layer; a conductive layer forming a Schottky junction with the semiconductor layer; and a tunneling barrier layer between the semiconductor layer and the conductive layer, wherein the tunneling barrier layer may be configured to block a dark current between the semiconductor layer and the conductive layer.

The tunneling barrier layer may be configured to increase a thickness of a Schottky barrier formed between the conductive layer and the semiconductor layer.

A difference between a conduction energy level of the tunneling barrier layer and an electron affinity of the semiconductor layer may be less than or equal to 0.5 electron volts (eV).

A bandgap energy of the tunneling barrier layer may be higher than a bandgap energy of the semiconductor layer.

A bandgap energy of the tunneling barrier layer may be greater than or equal to 2 electron volts (eV).

A thickness of the tunneling barrier layer may be less than or equal to 30 nanometers (nm).

The tunneling barrier layer may include a metal oxide semiconductor.

The metal oxide semiconductor may include at least one of $TiO_2$, $SnO_2$, ZnO, $WO_3$, $Nb_2O_5$, $BaSnO_3$, $Zn_2SnO_4$, $SrTiO_3$, $BaTiO_3$, $Zn2Ti_3O_8$, $SiO_2$, $Al_2O_3$, $HfO_2$, MgO, $MoO_3$, $FezO_3$, $Ta_2O_3$, TaON, and $In_2O_3$.

The conductive layer may include a first conductive layer forming the Schottky junction with the semiconductor layer.

The photodetector may further include a second conductive layer on the first conductive layer, wherein the second conductive layer may be configured to transmit light.

A work function of the first conductive layer may be set such that a barrier height of a Schottky barrier corresponding to the Schottky junction is lower than a barrier height of a Schottky barrier corresponding to a Schottky junction formed by the second conductive layer and the semiconductor layer.

The semiconductor layer may include an n-type semiconductor, and the work function of the first conductive layer satisfies an expression: $\Phi_M > \Phi_{Mi} > \chi_s$, where $\Phi_M$ represents a work function of the second conductive layer, $\Phi_{Mi}$ represents the work function of the first conductive layer, and $\chi_s$ represents an electron affinity of the semiconductor layer.

The photodetector may be configured to sense visible light in a visible band and infrared light in an infrared band.

The semiconductor layer may include a p-type semiconductor.

The photodetector may be configured to sense visible light in a visible band and ultraviolet light in an ultraviolet band.

The first conductive layer may include at least one of a metal, an alloy, a metal oxide, a metal nitride, and silicide.

The second conductive layer may include at least one of ITO, IWO, IZO, GZO, GIZO, and AZO.

In accordance with an aspect of the disclosure, an image sensor includes a sensor array including a plurality of light-sensing elements, wherein each light-sensing element of the plurality of light-sensing elements includes a photodetector; and a processor configured to decode a photoelectric signal generated at the each light-sensing element, wherein the photodetector includes: a semiconductor layer; a conductive layer configured to form a Schottky junction with the semiconductor layer; and a tunneling barrier layer arranged between the semiconductor layer and the conductive layer, wherein the tunneling barrier layer may be configured to block a dark current between the semiconductor layer and the conductive layer.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
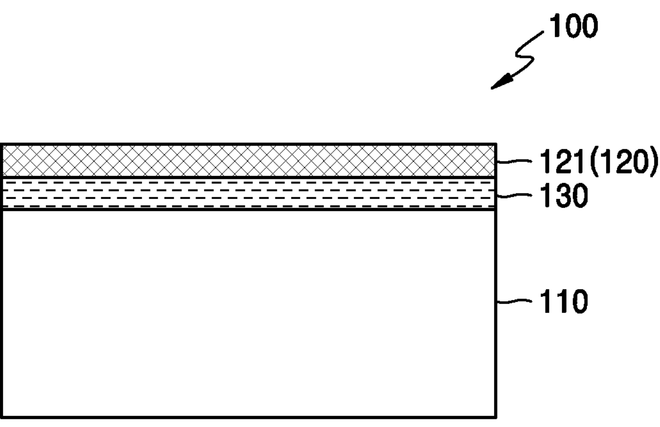
FIG. 1 is a schematic diagram of a photodetector according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Embodiments will now be described more fully with reference to the accompanying drawings. The embodiments described herein are provided merely as an example, and various modifications may be possible from the embodiments. In the drawings, like reference numerals in the drawings denote like elements, and sizes of components in the drawings may be exaggerated for clarity and convenience of explanation.

It will be understood that when a component is referred to as being "on" another component or on an "upper part" of another component, the component can be directly on or contacting the other component, or can be over the other component in a non-contact manner.

While such terms as "first," "second," etc., may be used to describe various components, such terms are used only to distinguish one component from another, and are not intended to specify or require that materials or structures of components are different.

An expression used in the singular encompasses the expression of the plural, unless it has a clearly different meaning in the context. When a portion "includes" an element, another element may be further included, rather than excluding the existence of the other element, unless otherwise described.

Moreover, the terms "part," "module," etc. refer to a unit processing at least one function or operation, and may be implemented by a hardware, a software, or a combination thereof.

The use of the terms "a" and "an" and "the" and similar referents in the context of describing embodiments (especially in the context of the following claims) are to be construed to cover both the singular and the plural.

Also, the steps of all methods described herein can be performed in any suitable order unless otherwise indicated herein or otherwise clearly contradicted by context. The use of any and all exemplary languages (e.g., "such as") provided herein, are intended merely to better illuminate the technical ideas and does not pose a limitation on the scope of rights unless otherwise claimed.

Figure 2:
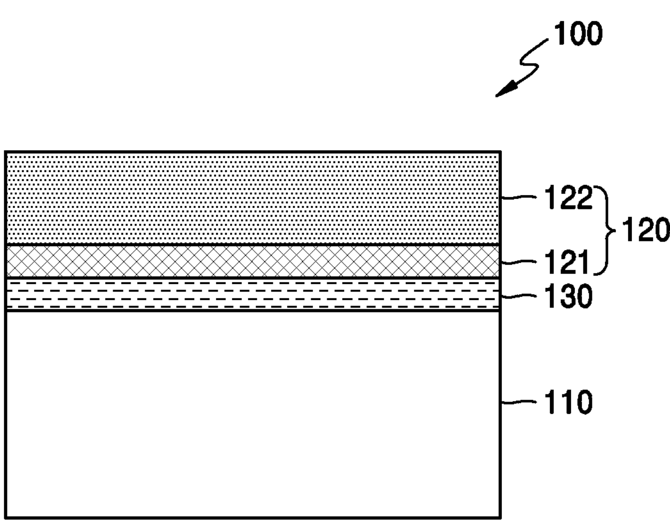
FIG. 2 is a schematic diagram of a photodetector according to an embodiment.

FIGS. 1 and 2 are schematic diagrams of a photodetector 100 according to an embodiment. With reference to FIGS. 1 and 2, the photodetector 100 may include a semiconductor layer 110, a conductive layer 120 on the semiconductor layer 110, and a tunneling barrier layer 130 between the semiconductor layer 110 and the conductive layer 120. The conductive layer 120 may form a Schottky junction structure between the semiconductor layer 110 and the conductive layer 120.

The semiconductor layer 110 may include a silicon semiconductor. For example, the semiconductor layer 110 may be n-type Si or p-type Si. The semiconductor layer 110 may be, for example, a silicon substrate. Electrodes, which may apply an electrical signal to the Schottky junction structure or measure an electrical signal generated at the Schottky junction structure, may be further formed on the silicon substrate. In embodiments, a first electrode may be arranged to be in electrical contact with the conductive layer 120 and a second electrode may be arranged to be in electrical contact with the silicon substrate of the semiconductor layer 110. The first electrode may have various shapes which may include an opening through which light may be incident through the conductive layer 120, and may be in electrical contact with the conductive layer 120. In a part of the silicon substrate, an ohmic contact area doped with an n-type or p-type dopant at a higher concentration than other areas may be formed. The second electrode may be in contact with the ohmic contact area. The contact structure between the first electrode and the conductive layer 120 and the contact structure between the silicon substrate and the second electrode are not limited to the foregoing, and various contact structures may be implemented considering the conductivity type of the silicon substrate.

Because the silicon semiconductor layer 110 may have a high charge transfer rate and a high quantum efficiency in the visible light band, for example, in a wavelength band of 400 nm to 700 nm, light in the visible light band may be detected with a high efficiency. However, in a near infrared (NIR) band, for example, a wavelength band of 700 nm to 1,600 nm, light absorption may be less likely to occur in the silicon semiconductor layer. Accordingly, to detect light of NIR band, materials having a relatively low bandgap energy in comparison to the silicon semiconductor layer 110, such as Ge or InGaAs, may be used. However, such materials may be difficult to synthesize and, in particular, to form on a silicon substrate.

According to embodiments, the photodetector 100 may have a Schottky junction which includes the conductive layer 120 and the semiconductor layer 110. Due to the internal photo-emission effect by the light absorption in the conductive layer 120, a photocurrent may be generated when light incident on the top of the conductive layer 120 or on the bottom of the semiconductor layer 110 has energy that is greater than the barrier height (for example, the energy) of the Schottky barrier. Accordingly, the photodetector 100 may be capable of detecting light from the visible band to the NIR band. In addition, when a reverse voltage is applied, the photodetector 100 including the Schottky junction according embodiments may be driven with a lower voltage than a silicon P-N junction structure, and also may allow relatively fast switching between forward and reverse bias voltages. Moreover, the photodetector 100 including the Schottky junction according to embodiments may have a simpler manufacturing process and thus have lower mass-production costs, compared to the P-N junction structure.

With reference to FIG. 1, the conductive layer 120 may have a single-layer structure. For example, the conductive layer 120 may include a first conductive layer 121. The first conductive layer 121 may form a Schottky junction or a Schottky junction structure between the semiconductor layer 110 and the first conductive layer 121. The first conductive layer 121 may include a metal, an alloy, a metal nitride, silicide, a transparent conductive oxide (TCO), etc. The metal may include, for example, Au, Al, Ag, Cu, Pt, Ni, W, Ti, Mo, Ru, Ge, Ta, Hf, Nb, Zr, or V. The alloy may include, for example, AlNd. The metal nitride may include, for example, TiN, AlN, TaN, $Ta_2N$, $TasN_5$, $W_2N$, WN, or $WN_2$. The silicide may include, for example, TiSi, $TiSi_2$, $Ti_5Si_3$, $VSi_2$, $FeSi_2$, $CoSi_2$, PtSi, $Pt_2Si$, NiSi, $NiSi_2$, $Ni_2Si$, CusSi, YSi, ZrSi, $NbSi_2$, $MoSi_2$, PdSi, $Pd_2Si$, ErSi, YbSi, $YbSi_2$, $ZrSi_2$, HfSi, $HfSi_2$, TaSi, $TaSi_2$, NbSi, $NbSi_2$, ZrSi, $ZrSi_2$, VSi, $VSi_2$, WSi, $WSi_2$, GeSi, OsSi, IrSi, $IrSi_3$, AISi, CuSi RuSi, or $Ru_2Si_3$. The TCO may include, for example, ITO, IWO, IZO, GZO, GIZO, or AZO. Based on the first conductive layer 121 being a light incident side on which light is incident, or is intended to be incident, a thickness of the first conductive layer 121 may be set or determined such that the first conductive layer 121 is capable of or able to transmit incident light. In embodiments, the thickness of the first conductive layer 121 may be about 100 nanometers (nm) or less. For example, the thickness of the first conductive layer 121 may be 50 nm or less or 5 nm or less. Based on the first conductive layer 121 having a relatively large thickness, the semiconductor layer 110 may be the light incident side.

According to the structure illustrated in FIG. 1, some of the incident light may be absorbed by the first conductive layer 121, and the rest may reach the semiconductor layer 110. The photons absorbed by the first conductive layer 121 may form a photocurrent by the internal photo-emission effect. The photons absorbed by the semiconductor layer 110 may form a photocurrent by the photovoltaic effect. By these two mechanisms, a wide light absorption band and improved quantum efficiency may be implemented. In addition, depending on the barrier height of the Schottky barrier between the first conductive layer 121 and the semiconductor layer 110, absorption of light in the short wavelength infrared (SWIR) band may also be possible.

The conductive layer 120 may have a multi-layer structure as illustrated in FIG. 2. For example, the conductive layer 120 may include the first conductive layer 121 and a second conductive layer 122 which is light-transmissive and arranged on the first conductive layer 121. In embodiments, a layer being "light-transmissive" may indicate that the layer is configured to, or capable of, transmitting some or all of light that is incident on the layer. The first conductive layer 121 may form a Schottky junction structure between the semiconductor layer 110 and the first conductive layer 121. The first conductive layer 121 may include a metal, an alloy, a metal nitride, silicide, etc. The metal may include, for example, Au, Al, Ag, Cu, Pt, Ni, W, Ti, Mo, Ru, Ge, Ta, Hf, Nb, Zr, or V. The alloy may include, for example, AlNd. The metal nitride may include, for example, TIN, AlN, TaN, $Ta_2N$, $Ta_3N_5$, $W_2N$, WN, or $WN_2$. The silicide may include, for example, TiSi, $TiSi_2$, $Ti_5Si_3$, $VSi_2$, $FeSi_2$, $CoSi_2$, PtSi, $Pt_2Si$, NiSi, $NiSi_2$, NizSi, CusSi, YSi, ZrSi, $NbSi_2$, $MoSi_2$, PdSi, $Pd_2Si$, ErSi, YbSi, $YbSi_2$, $ZrSi_2$, HfSi, $HfSi_2$, TaSi, $TaSi_2$, NbSi, $NbSi_2$, ZrSi, $ZrSi_2$, VSi, $VSi_2$, WSi, $WSi_2$, GeSi, OsSi, IrSi, $IrSi_3$, AISi, CuSi RuSi, or $Ru_2Si_3$. The second conductive layer 122 may be a light-transmissive conductive layer having light transmissivity and high electrical conductivity. For example, the second conductive layer 122 may include a TCO having transmissivity with respect to light in visible light band or infrared band. The TCO may include, for example, ITO, IWO, IZO, GZO, GIZO, or AZO.

The first conductive layer 121 may have a work function which is different from a work function of the second conductive layer 122. The work function of the first conductive layer 121 may be determined considering materials of adjacent second conductive layer 122 and the semiconductor layer 110 to lower the barrier height of the Schottky barrier. The barrier height of the Schottky barrier may refer to an amount of energy required for a charge carrier formed in the first conductive layer 121 by incident light to move to the semiconductor layer 110. For example, the work function of the first conductive layer 121 may be set or determined such that the barrier height of the Schottky barrier formed at the Schottky junction structure between the first conductive layer 121 and the semiconductor layer 110 is lower than the barrier height of the Schottky barrier of the Schottky junction structure formed by the second conductive layer 122 and the semiconductor layer 110.

The work function of the first conductive layer 121 may be set or determined according to, or based on, a material and conductivity type (n-type, p-type) of the semiconductor layer 110 and a work function of the second conductive layer 122. For example, based on the semiconductor layer 110 being an n-type semiconductor layer, the work function of the first conductive layer 121 may satisfy Formula (1) below, and the barrier height of the Schottky barrier may be represented by Formula (2) below. For example, based on the semiconductor layer 110 being a p-type semiconductor layer, the work function of the first conductive layer 121 may satisfy Formula (3) below, and the barrier height of the Schottky barrier may be represented by Formula (4) below. In Formula (1), Formula (2), Formula (3), and Formula (4), M represents the work function of the second conductive layer 122, $\Phi_{Mi}$ represents the work function of the first conductive layer 121, $\chi_s$ represents the electron affinity of the semiconductor layer 110, and $E_g$ represents the bandgap energy of the semiconductor layer 110.

$$\Phi_M > \Phi_{Mi} > X_S \quad \text{Formula (1)}$$

$$\Phi_B = \Phi_{Mi} - X_S \quad \text{Formula (2)}$$

$$\Phi_M < \Phi_{Mi} < X_S + E_g \quad \text{Formula (3)}$$

$$\Phi_B = E_g - (\Phi_{Mi} - X_S) \quad \text{Formula (4)}$$

For example, based on the second conductive layer 122 being ITO, and the semiconductor layer 110 is n-Si, the first conductive layer 121 may be, for example, TiN. However, this is just an example, and embodiments are not limited thereto. The first conductive layer 121 may be a metal nitride such as AlN, TaN, $Ta_2N$, $Ta_3N_5$, $W_2N$, WN, and $WN_2$, or may be Ta, Al, Ti, Mo, V, Mn, Nb, Mo, etc. which have a relatively low work function. As another example, based on the second conductive layer 122 being ITO, and the semiconductor layer 110 being p-type Si, the first conductive layer 121 may be, for example, Cu or Ni. The thickness of the first conductive layer 121 may be set to transmit the light incident through the second conductive layer 122. The thickness of the first conductive layer 121 may be about 100 nm or less. For example, the thickness of the first conductive layer 121 may be 50 nm or less or 5 nm or less. The thickness of the second conductive layer 122 may be about 100 nm or less, similar to the first conductive layer 121. For example, the thickness of the second conductive layer 122 may be 50 nm or less or 5 nm or less.

The internal quantum efficiency of the first conductive layer 121 may be affected by the thickness of the first conductive layer 121. The greater the thickness of the first conductive layer 121, the lower the generation efficiency of photoexcited charge carriers may be, and the increased reflection of photons on a surface of the first conductive layer 121 may lower the internal quantum efficiency. According to the structure including the first conductive layer 121, the second conductive layer 122, and the semiconductor layer 110 illustrated in FIG. 2, the thickness of the first conductive layer 121 may be relatively thin, and by properly selecting the work functions and energy levels of the semiconductor layer 110, the first conductive layer 121 and the second conductive layer 122, a photocurrent may be generated with high quantum efficiency in a wide range from the visible light band to the NIR band. According to the structure illustrated in FIG. 2, some of the incident light may be absorbed by the first conductive layer 121 and the second conductive layer 122, and the rest may reach the semiconductor layer 110. The photons absorbed by the first conductive layer 121 and the second conductive layer 122 may generate a photocurrent by the internal photo-emission effect. The photons absorbed by the semiconductor layer 110 may generate a photocurrent by the photovoltaic effect. By these two mechanisms, a wide light absorption band and improved quantum efficiency may be implemented. Moreover, depending on the barrier height of the Schottky barrier, absorption of light in the SWIR band may also be possible.

In a photodetector using a Schottky barrier, the structure of the Schottky barrier may essentially have a very thin thickness, and have an energy band diagram which is drastically inclined by energy band bending. Due to this, a leakage current may be generated by the quantum mechanical tunneling. For example, based on the field emission between the first conductive layer 121 and the semiconductor layer 110, charge carriers having energy lower than the barrier height of the Schottky barrier may pass through the Schottky barrier. This may correspond to a dark current which occurs without incident light, and may cause noise to be generated in a photodetector or an image sensor employing a photodetector. Accordingly, suppressing the dark current may improve performance of a photodetector or an image sensor employing a photodetector.

In consideration of the foregoing, the photodetector 100 according to embodiments may include the tunneling barrier layer 130 between the conductive layer 120 and the semiconductor layer 110 as illustrated in FIGS. 1 and 2. The tunneling barrier layer 130 may increase the physical thickness of the Schottky barrier structure while having at most a small effect on the barrier height of the Schottky barrier in order to reduce or prevent a leakage current due to quantum mechanical tunneling. To lessen the effect on the barrier height of the Schottky barrier, the tunneling barrier layer 130 may be formed of, or include, a material having a conduction band energy level that is similar to an electron affinity of the semiconductor layer 110. For example, a difference between the conduction band energy level of the tunneling barrier layer 130 and the electron affinity of the semiconductor layer 110 may be 0.5 electron volts (eV) or less.

In addition, to reduce or prevent a dark current generated due to electron-hole separation by light having low energy, the bandgap energy of the tunneling barrier layer 130 may be greater than the bandgap energy of the semiconductor layer 110. For example, the bandgap energy of the tunneling barrier layer 130 may be greater than 2 eV. The tunneling barrier layer 130 may be formed of a metal oxide semiconductor having wide bandgap energy. The metal oxide semiconductor may be or include, for example, $TiO_2$, $SnO_2$, ZnO, $WO_3$, $Nb_2O_5$, $BaSnO_3$, $Zn_2SnO_4$, $SrTiO_3$, $BaTiO_3$, $Zn2Ti_3O_8$, $SiO_2$, $Al_2O_3$, $HfO_2$, MgO, $MoO_3$, $FezO_3$, $Ta_2O_3$, TaON, or $In_2O_3$.

The thickness of the tunneling barrier layer 130 may be determined such that the dark current is reduced or prevented. The thickness of the tunneling barrier layer 130 may be 30 nm or less. When the thickness of the tunneling barrier layer 130 is greater than 30 nm, it may be difficult for charge carriers to move past the tunneling barrier layer 130 in normal state. To secure mobility of the charge carriers, the thickness of the tunneling barrier layer 130 may be, for example, 10 nm or less.

Figure 3:
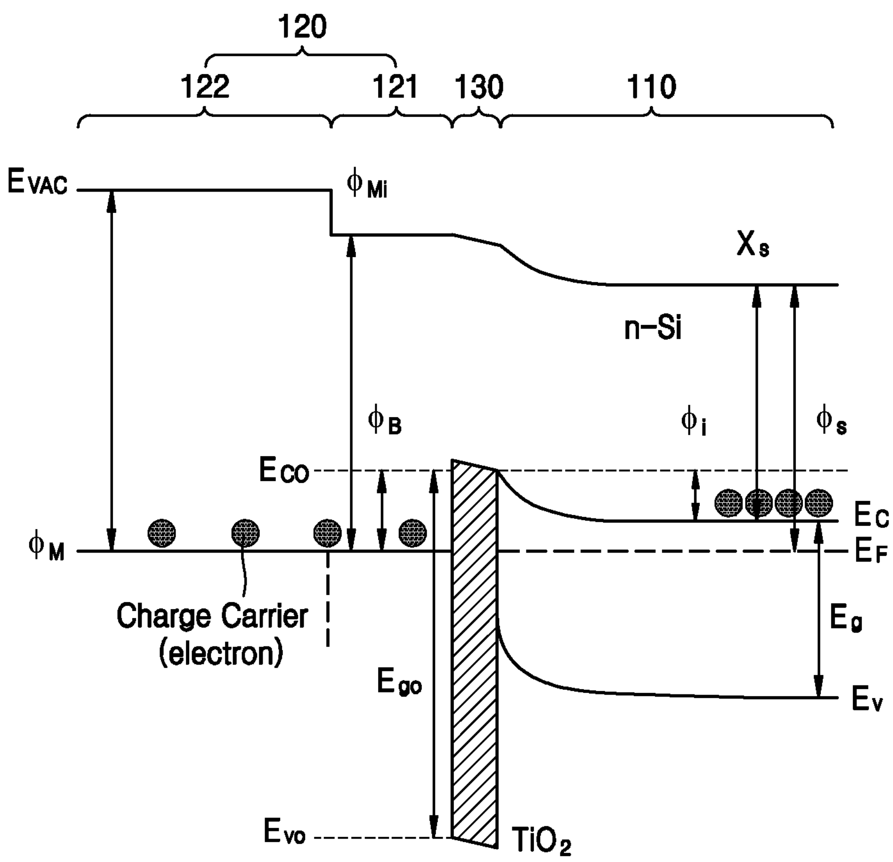
FIG. 3 is an energy band diagram of the photodetector of FIG. 2, and illustrates a state in which a bias voltage is not applied, according to an embodiment.
Figure 4:
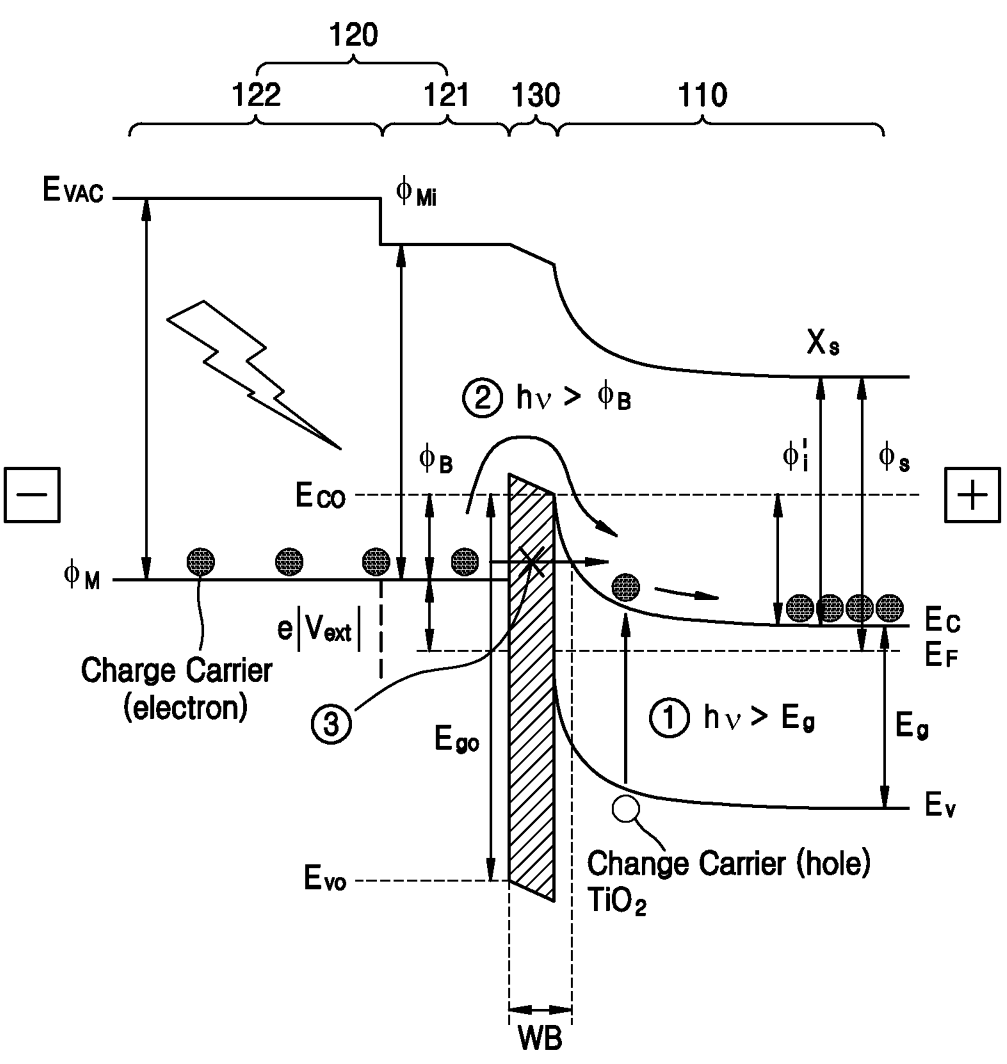
FIG. 4 is an energy band diagram of the photodetector of FIG. 2, and illustrates a state in which a reverse bias voltage is applied, according to an embodiment.

FIG. 3 is an example of an energy band diagram corresponding to the photodetector 100 of FIG. 2, and illustrates a state in which a bias voltage is not applied. FIG. 4 is an example of an energy band diagram corresponding to the photodetector 100 of FIG. 2, and illustrates a state in which a reverse bias voltage is applied. For example, in FIGS. 3 and 4, the semiconductor layer 110 may be n-Si, the first conductive layer 121 may be TiN, the second conductive layer 122 may be ITO, and the tunneling barrier layer 130 may be $TiO_2$.

$E_{VAC}$: energy level of vacuum $E_{CO}$: conduction band energy level of the tunneling barrier layer 130

$E_{VO}$: valence band energy level of the tunneling barrier layer 130

$E_{go}$: band gap energy of the tunneling barrier layer 130

$E_C$: conduction band energy level of the semiconductor layer 110

$E_V$: valence band energy level of the semiconductor layer 110

$E_F$: Fermi energy level of the semiconductor layer 110

$E_g$: band gap energy of the semiconductor layer 110

$\Phi_I$: built in potential $\Phi_I'$: built in potential under reverse bias $\Phi_s$: work function of the semiconductor layer 110

In this case, $\Phi_M$=4.7 eV>$\Phi_{Mi}$=4.5 eV>$\chi_s$=4.05 eV, which satisfies Formula (1). According to Formula (2), the barrier height of the Schottky barrier (e.g., the Schottky barrier formed by the first conductive layer 121 and the semiconductor layer 110) may be $\Phi_B=\Phi_{Mi}-\chi_s$=4.5−4.05=0.45 eV. As a comparison, a Schottky barrier formed by combination of the second conductive layer 122 and the semiconductor layer 110, would have a barrier height of $\Phi_M-\chi_s$=4.7-4.05=0.65 eV. As such, the barrier height of the Schottky barrier according to embodiments may be lower than the barrier height of the Schottky barrier formed by combination of the second conductive layer 122 and the semiconductor layer 110. When the barrier height of the Schottky barrier is lowered, light having low energy may be detected by the photodetector 100, and thus, the photodetector 100 may be capable of detecting light of longer wavelengths.

When a reverse bias voltage is applied, a Fermi energy level ($E_F$) of the semiconductor layer 110 may decrease by the energy ($eV_{ext}$) provided by the bias voltage as illustrated in FIG. 4. Without the tunneling barrier layer 130, even without incident light, some of majority charge carriers having energy lower than the barrier height of the Schottky barrier may move from the conductive layer 120 to the semiconductor layer 110. For example, the electrons may pass through the Schottky barrier and move from the first conductive layer 121 to the semiconductor layer 110 by quantum mechanical tunneling, which leads to generation of dark current.

According to embodiments, the tunneling barrier layer 130 may be arranged between semiconductor layer 110 and the conductive layer 120, for example, the first conductive layer 121. The electron affinity ($\chi_s$) of Si forming the semiconductor layer 110 may be −4.05 eV. The conduction band energy level (Eco) of $TiO_2$ forming the tunneling barrier layer 130 may be −4.0 eV, which may be different from the electron affinity of the Si forming the semiconductor layer 110 by only about 0.05 eV, and thus, the conduction band energy level and the electron affinity described above may be considered to be substantially identical to each other. Accordingly, the tunneling barrier layer 130 may only slightly affect the barrier height of the Schottky barrier between the first conductive layer 121 and the semiconductor layer 110. The addition of the tunneling barrier layer 130 may increase the physical thickness of the Schottky barrier as indicated by WB in FIG. 4. Therefore, because tunneling of electrons may be reduced or prevented, the dark current may be reduced or prevented as indicated by ③ in FIG. 4.

In the state illustrated FIG. 4, when the visible light is incident onto the photodetector 100, light absorption may occur inside the semiconductor layer 110. When the energy (hv) of incident light is greater than the bandgap energy ($E_g$) of Si as indicated by ① in FIG. 4, electron-hole separation may occur in the semiconductor layer 110, and photocurrent may be detected.

The bandgap energy ($E_g$) of Si forming the semiconductor layer 110 may be 1.12 eV. As an example, the valence band energy level ($E_{vo}$) of $TiO_2$ forming the tunneling barrier layer 130 may be −7.2 eV and the conduction band energy level ($E_{co}$) may be −4.0 eV, and therefore the bandgap energy ($E_{go}$) of $TiO_2$ forming the tunneling barrier layer 130 may be $E_{vo}-E_{co}$=7.2-4.0=3.2 eV, which may be greater than the bandgap energy ($E_g$) of Si. Accordingly, because the $TiO_2$-tunneling barrier layer 130 may not absorb light in visible light band and infrared band having lower energy than the visible light band, the $TiO_2$-tunneling barrier layer 130 may be suitable to be used as a tunneling barrier layer preventing a dark current.

When infrared light is incident onto the photodetector 100 in the state illustrated in FIG. 4, the energy of the incident light may be lower than the bandgap energy of Si. Therefore, due to the light energy absorbed in the first conductive layer 121 of FIG. 1, or in the first and second conductive layers 121 and 122 of FIG. 2, hot electrons which have energy that is lower than the bandgap energy of the Si-semiconductor layer 110, and is higher than the barrier height of the Schottky barrier, may be generated. As indicated by ② in FIG. 4, hot electrons may flow from the conductive layer 120 towards the semiconductor layer 110 over the Schottky barrier, and the photocurrent may be detected.

Figure 5A:
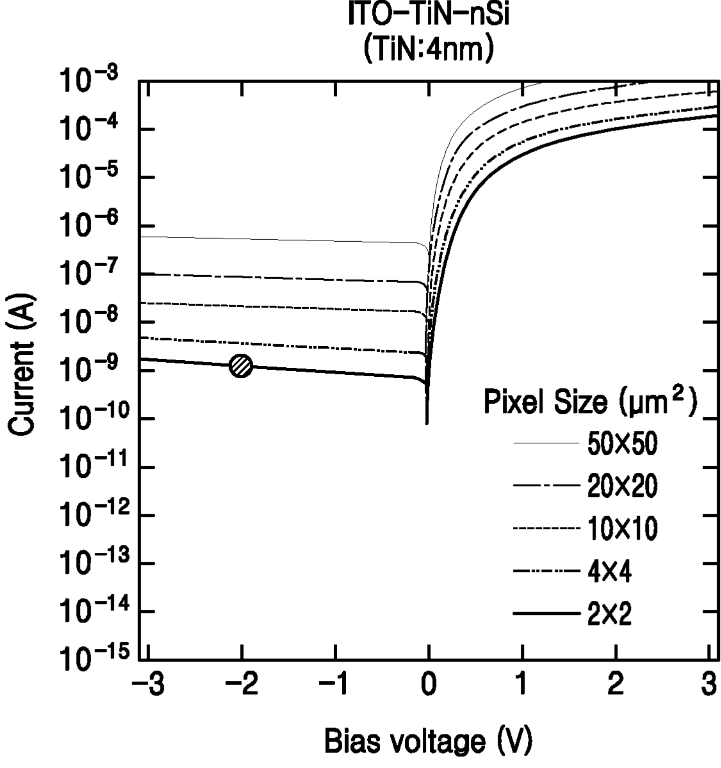
FIG. 5A is a graph showing results of measuring dark current of a photodetector, under a condition in which there is no incident light, according to an embodiment.
Figure 5B:
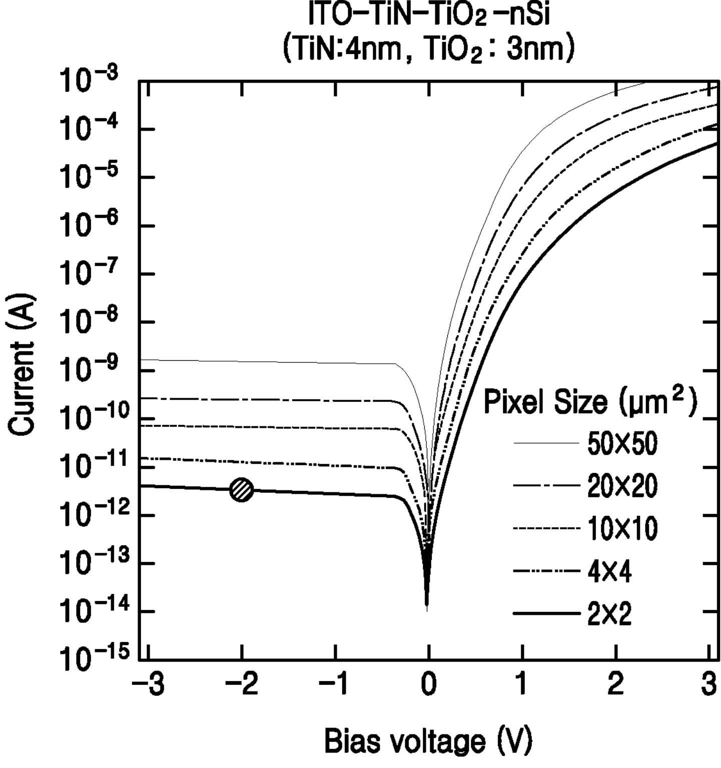
FIG. 5B is a graph showing results of measuring dark current of a photodetector, under a condition in which there is no incident light, according to an embodiment.
Figure 5C:
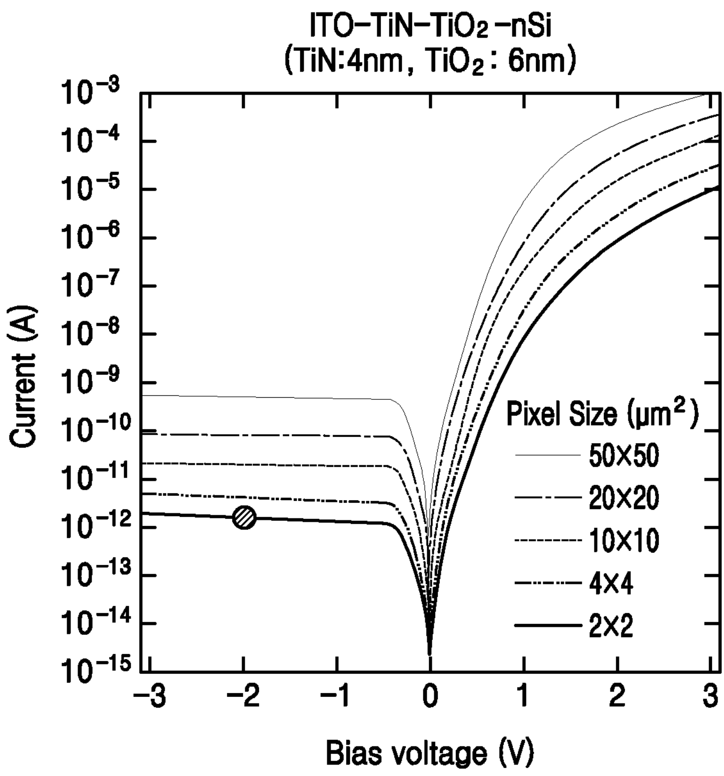
FIG. 5C is a graph showing results of measuring dark current of a photodetector, under a condition in which there is no incident light, according to an embodiment.

FIG. 5A is a graph showing example results of measuring dark current of a photodetector having a structure including a second conductive layer 122 which includes ITO, a first conductive layer 121 which includes TIN, and a semiconductor layer 110 which includes n-type Si, under a condition in which there is no incident light. In FIG. 5A, the thickness of TiN may be 4 nm. FIG. 5B is a graph showing example results of measuring dark current of the photodetector 100 having a structure including a second conductive layer 122 which includes ITO, a first conductive layer 121 which includes TiN, a tunneling barrier layer 130 which includes $TiO_2$, and a semiconductor layer 110 which includes n-type Si, according to an embodiment, under a condition in which there is no incident light. In FIG. 5B, the thickness of TiN may be 4 nm, and the thickness of $TiO_2$ may be 3 nm. FIG. 5C is a graph showing example results of measuring dark current of the photodetector 100 having a structure including a second conductive layer 122 which includes ITO, a first conductive layer 121 which includes TiN, a tunneling barrier layer 130 which includes $TiO_2$, and a semiconductor layer 110 which includes n-type Si, according to an embodiment, under a condition in which there is no incident light. In FIG. 5C, the thickness of TiN may be 4 nm, and the thickness of $TiO_2$ may be 6 nm. In FIGS. 5A to 5C, a pixel to be measured may have a size of 50 micrometers (μm)×50 μm, 20 μm×20 μm, 10 μm×10 μm, 4 μm×4 μm, or 2 μm×2 μm. When the pixel has the size of 2 μm×2 μm, as shown in FIG. 5A, and when the reverse bias current of −2 V is applied, the dark current may be about 1.3 nA. In the case of FIG. 5B, when the reverse bias voltage of −2 V is applied, the dark current may be about 3.3 pA, which is about 1/394 of the dark current in the case where the tunneling barrier layer 130 is not applied. In the case of FIG. 5C, when the reverse bias voltage of −2 V is applied, the dark current may be about 1.5 pA, which is about 1/867 of the dark current in the case where the tunneling barrier layer 130 is not applied. Therefore, according to embodiments, the $TiO_2$-tunneling barrier layer 130 may make a huge contribution to reduction of dark current under a condition in which there is no incident light.

Figure 6A:
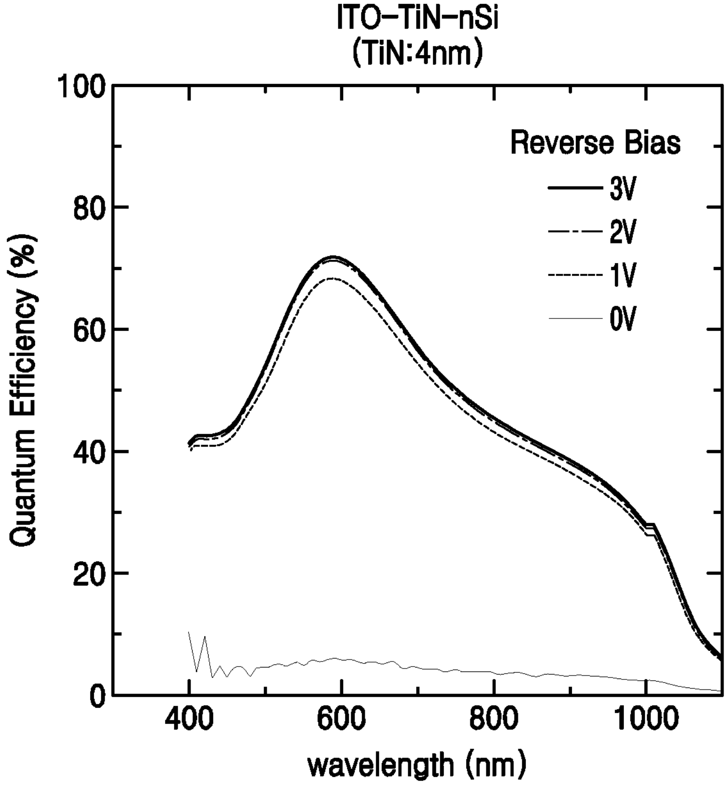
FIG. 6A is a graph showing results of measuring quantum efficiency according to wavelength of incident light of a photodetector according to an embodiment.
Figure 6B:
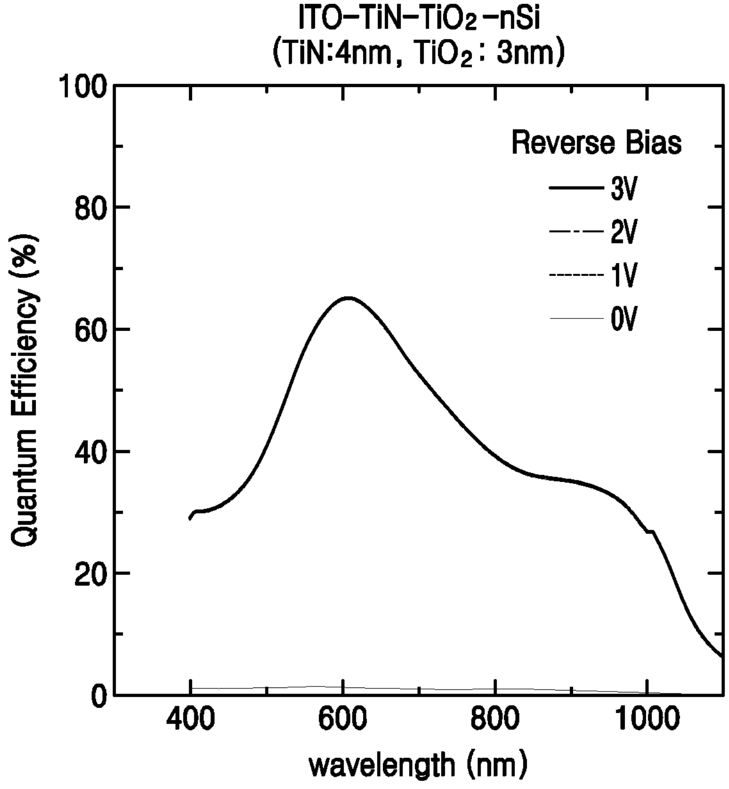
FIG. 6B is a graph showing results of measuring quantum efficiency according to wavelength of incident light of a photodetector according to an embodiment.
Figure 6C:
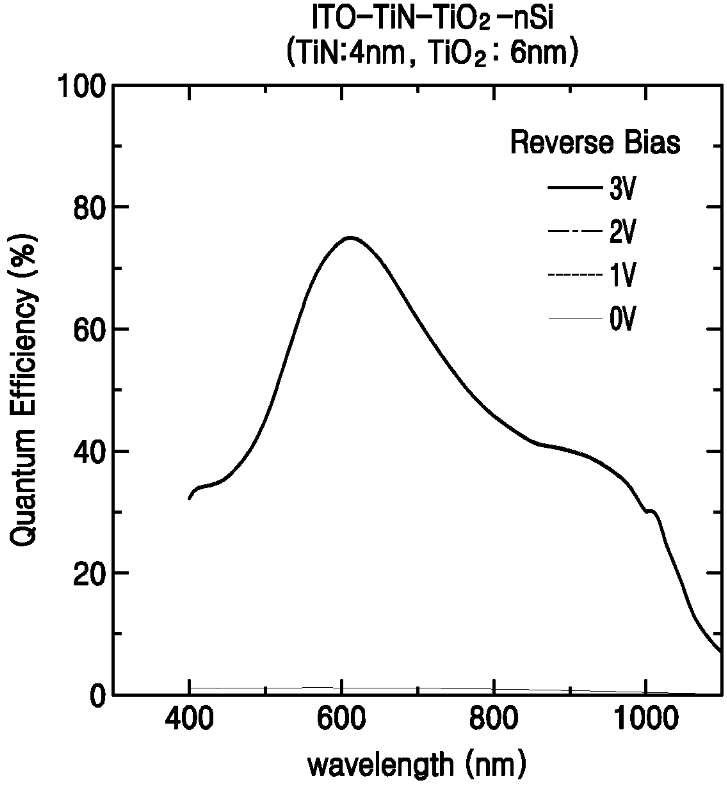
FIG. 6C is a graph showing results of measuring quantum efficiency according to wavelength of incident light of a photodetector according to an embodiment.

FIG. 6A is a graph showing example results of measuring quantum efficiency according to a photodetector having a structure including second conductive layer 122 which includes ITO, a first conductive layer 121 which includes TiN, and a semiconductor layer 110 which includes n-type Si. In FIG. 6A, the thickness of TIN may be 4 nm, and the size of the pixel may be 1 mm×1 mm. FIG. 6B is a graph showing example results of measuring quantum efficiency according to the photodetector 100 having a structure including a second conductive layer 122 which includes ITO, a first conductive layer 121 which includes TiN, a tunneling barrier layer 130 which includes $TiO_2$, and a semiconductor layer 110 which includes n-type Si, according to an embodiment. In FIG. 6B, the thickness of TiN may be 4 nm, the thickness of $TiO_2$ may be 3 nm, and the size of the pixel may be 3.6 mm×3.6 mm. FIG. 6C is a graph showing example results of measuring quantum efficiency according to the photodetector 100 having a structure including a second conductive layer 122 which includes ITO, a first conductive layer 121 which includes TiN, a tunneling barrier layer 130 which includes $TiO_2$, and a semiconductor layer 110 which includes n-type Si, according to an embodiment. In FIG. 6C, the thickness of TiN may be 4 nm, the thickness of $TiO_2$ may be 6 nm, and the size of the pixel may be 3.6 mm×3.6 mm. In FIGS. 6B and 6C, the quantum efficiency in the case where the reverse bias voltage is 2 V or 1 V may be similar to the quantum efficiency in the case where the reverse bias voltage is 3 V. Accordingly, the curve showing the quantum efficiency in the case where the reverse bias voltage is 2 V or 1V may overlap the curve showing the quantum efficiency in the case where the reverse bias voltage is 3 V.

In FIG. 6A, the quantum efficiency may have a maximum value of 71.5% in the wavelength of 590 nm. In FIG. 6B, the quantum efficiency may be 65.3% in the wavelength of 610 nm. In FIG. 6C, the quantum efficiency may be 75% in the wavelength of 610 nm. From this, it may be understood that even when the $TiO_2$-tunneling barrier layer 130 is applied, the quantum efficiency may be only slightly affected or slightly increased.

Figure 7A:
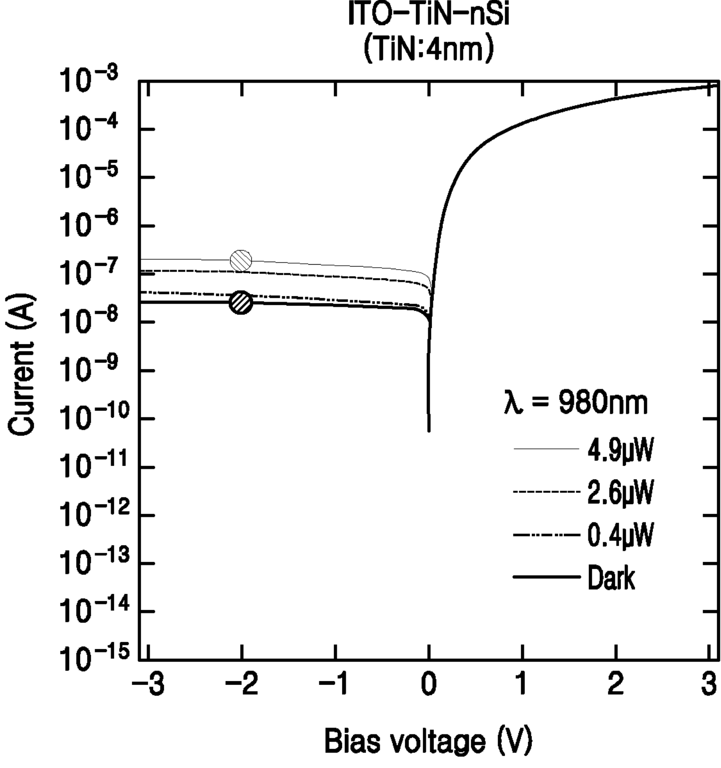
FIG. 7A is a graph showing results of measuring dark current and photocurrent of a photodetector according to an embodiment.
Figure 7B:
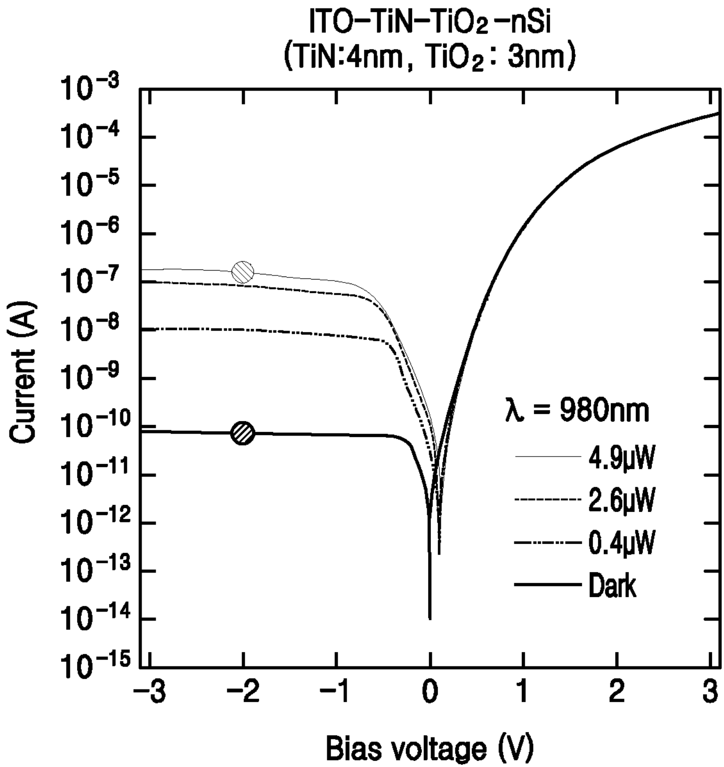
FIG. 7B is a graph showing results of measuring dark current and photocurrent of a photodetector according to an embodiment.
Figure 7C:
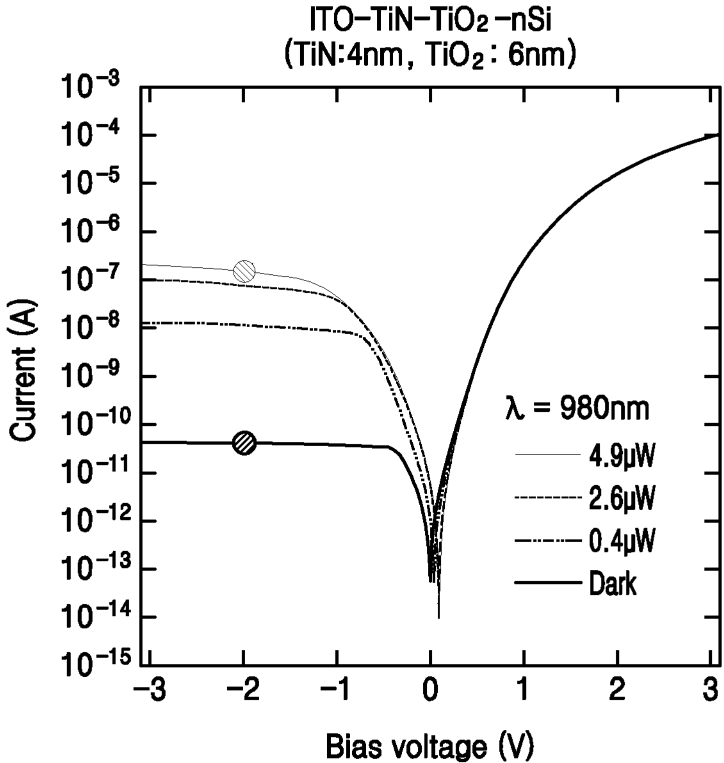
FIG. 7C is a graph showing results of measuring dark current and photocurrent of a photodetector according to an embodiment.

FIG. 7A is a graph showing example results of measuring dark current and photocurrent of a photodetector having a structure including second conductive layer 122 which includes ITO, a first conductive layer 121 which includes TiN, and a semiconductor layer 110 which includes n-type Si. In FIG. 7A, the thickness of TIN may be 4 nm, and the size of the pixel may be 10 mm×10 μm. FIG. 7B is a graph showing example results of measuring dark current and photocurrent of the photodetector 100 having a structure including a second conductive layer 122 which includes ITO, a first conductive layer 121 which includes TIN, a tunneling barrier layer 130 which includes $TiO_2$, and a semiconductor layer 110 which includes n-type Si, according to an embodiment. In FIG. 7B, the thickness of TiN may be 4 nm, the thickness of $TiO_2$ may be 3 nm, and the size of the pixel may be 10 μm×10 μm. FIG. 7C is a graph showing results of measuring dark current and photocurrent of the photodetector 100 having a structure including a second conductive layer 122 which includes ITO, a first conductive layer 121 which includes TiN, a tunneling barrier layer 130 which includes $TiO_2$, and a semiconductor layer 110 which includes n-type Si, according to an embodiment. In FIG. 7C, the thickness of TiN may be 4 nm, the thickness of $TiO_2$ may be 6 nm, and the size of the pixel may be 10 μm×10 μm.

First, the result of measuring dark current when the reverse bias voltage of −2 V is applied is further described. In the case of FIG. 7A, the dark current is about 26.3 nA. In this regard, in the case of FIG. 7B, the dark current is about 72.8 pA, which is about 1/361 of the dark current in the case of FIG. 7A in which the tunneling barrier layer 130 is not applied. In the case of FIG. 7C, the dark current is about 41.5 pA, which is about 1/634 of the dark current in the case of FIG. 7A in which the tunneling barrier layer 130 is not applied. This shows that the $TiO_2$-tunneling barrier layer 130 may make a huge contribution to reduction of dark current.

Next, the result of measuring photocurrent with respect to the incident light of 4.9 μW having a wavelength (λ) of 980 nm and when the reverse bias voltage of −2 V is applied is further described. In the case of FIG. 7A, the photocurrent excluding the dark current may be 189.8-26.3=163.5 nA. In this regard, in the case of FIG. 7B, the photocurrent excluding the dark current may be 147−0.073=146.9 nA, which is 1/1.1 of the photocurrent in the case of FIG. 7A in which the tunneling barrier layer 130 is not applied. In the case of FIG. 7C, the photocurrent excluding the dark current may be 157.2−0.0415=157.2 nA, which is 1/1.04 of the photocurrent in the case of FIG. 7A in which the tunneling barrier layer 130 is not applied. This shows that the change in the photocurrent by the $TiO_2$-tunneling barrier layer 130 may be insignificant.

Figure 8:
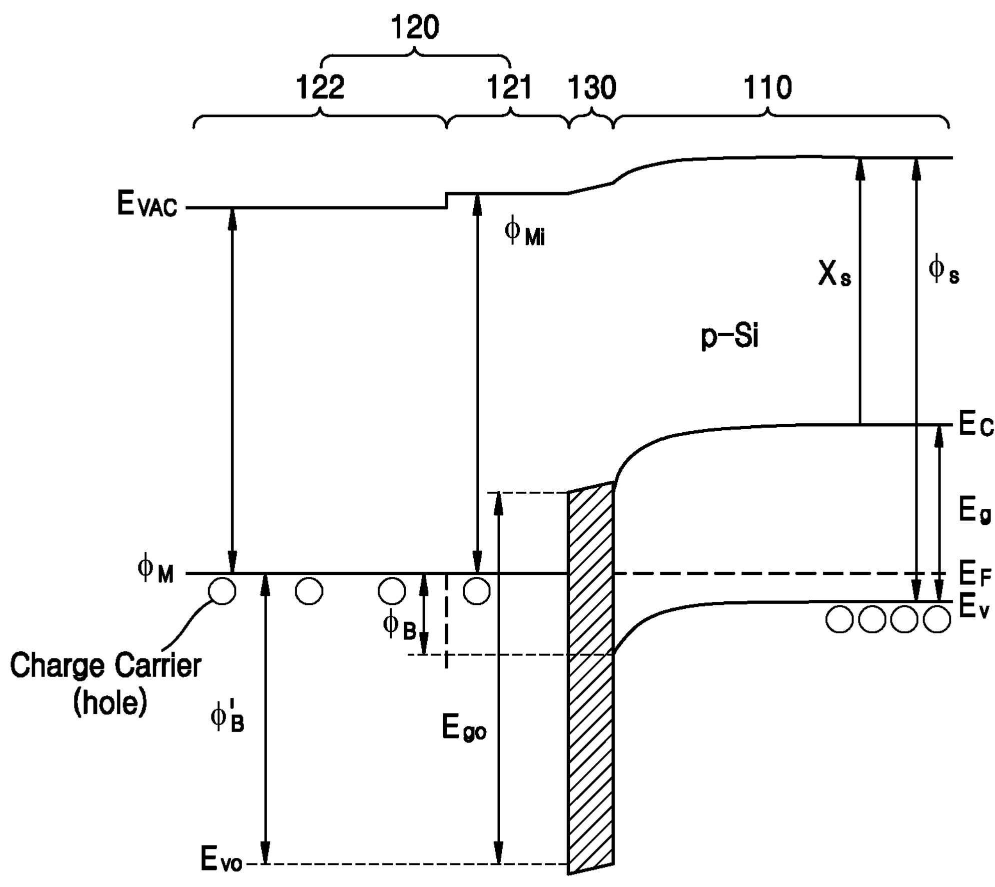
FIG. 8 is an energy band diagram of the photodetector of FIG. 2, and illustrates a state in which a bias voltage is not applied, according to an embodiment.
Figure 9:
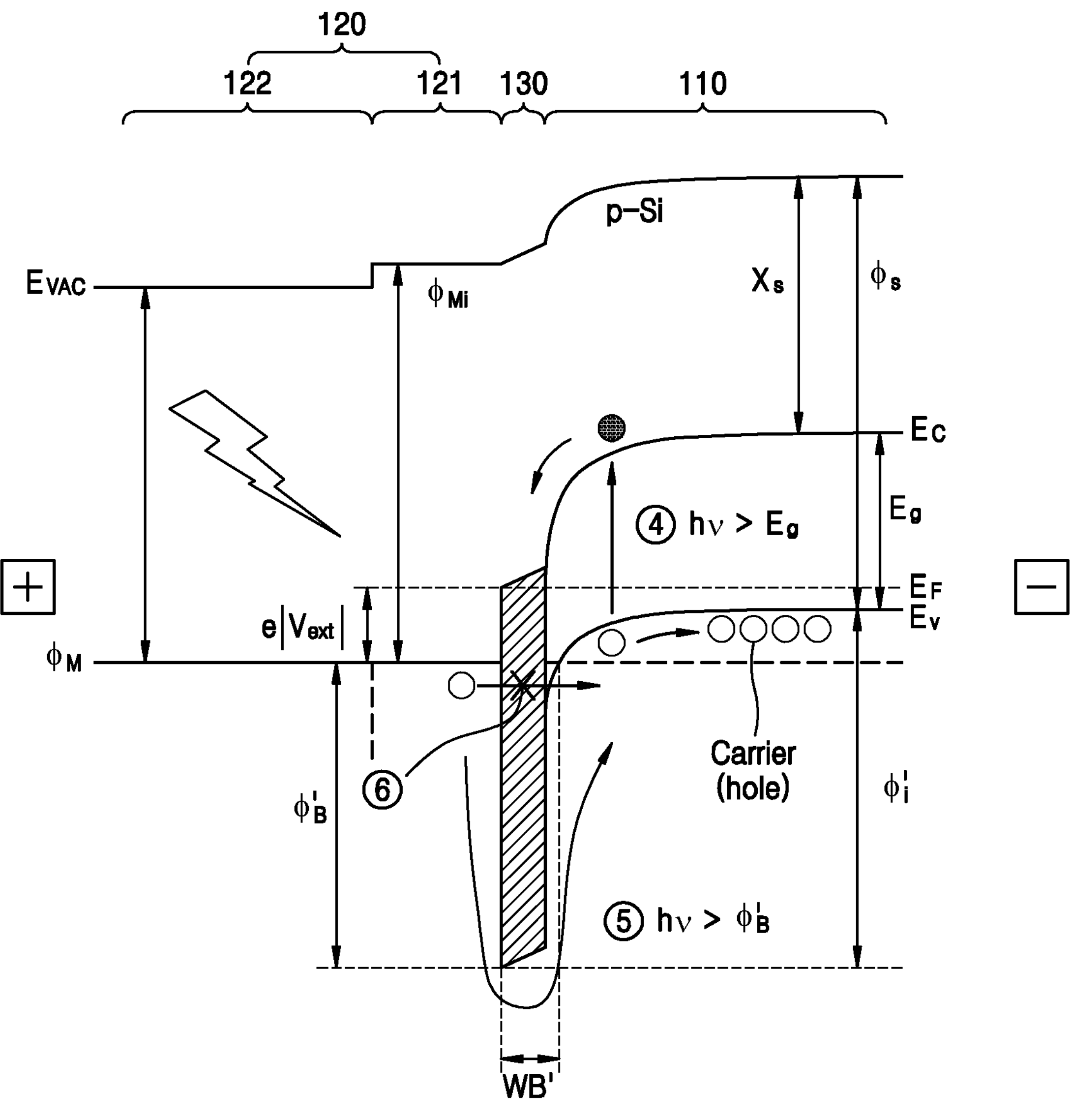
FIG. 9 is an energy band diagram of the photodetector of FIG. 2, and illustrates a state in which a reverse bias voltage is applied, according to an embodiment.

FIG. 8 is an example energy band diagram of the photodetector 100 of FIG. 2, and illustrates a state in which a bias voltage is not applied. FIG. 9 is an example energy band diagram of the photodetector 100 of FIG. 2 and illustrates a state in which a reverse bias voltage is applied. For example, in FIGS. 8 and 9, the semiconductor layer 110 may be p-type Si, the first conductive layer 121 may be Cu or Ni, the second conductive layer 122 may be or include ITO, and the tunneling barrier layer 130 may be or include $TiO_2$.

When the first conductive layer 121 is Cu, $\Phi_M$=4.7 eV<$\Phi_{Mi}$=4.98 eV<$\chi_s+E_g$=4.05+1.12=5.17 eV, which satisfies Formula (3). When the first conductive layer 121 is Ni, $\Phi_M$=4.7 eV<$\Phi_{Mi}$=5.04 eV<$\chi_s+E_g$=4.05+1.12=5.17 eV, which satisfies Formula (3). When the first conductive layer 121 is Cu, the barrier height of the Schottky barrier may be $\Phi_B=E_g-(\Phi_{Mi}-\chi_s)$=1.12−(4.98−4.05)=0.19 eV according to Formula (4). When the first conductive layer 121 is Ni, the barrier height of the Schottky barrier may be $\Phi_B=E_g-(\Phi_{Mi}-\chi_s)$=1.12−(5.04-4.05)=0.13 eV according to Formula (4). The barrier height of the Schottky barrier formed by combination of ITO and p-type Si may be $E_g-(\Phi_M-\chi_s)$=1.12−(4.7-4.05)=0.47 eV. As such, the barrier height of the Schottky barrier according to the embodiment may be lower than the barrier height of the Schottky barrier formed by combination of the second conductive layer 122 and the semiconductor layer 110. When the barrier height of the Schottky barrier is lowered, light energy which can be detected by the photodetector 100 may also be lowered, and accordingly, the photodetector 100 may detect light of longer wavelengths.

When a reverse bias voltage is applied, a Fermi energy level ($E_F$) of the semiconductor layer 110 may increase by the energy ($eV_{ext}$) provided by the bias voltage as illustrated in FIG. 9. Without the tunneling barrier layer 130, even without incident light, some of majority charge carriers having energy lower than the barrier height of the Schottky barrier may move from the conductive layer 120 to the semiconductor layer 110. For example, the holes may pass through the Schottky barrier and move to the semiconductor layer 110 by quantum mechanical tunneling, which leads to generation of dark current.

According to embodiments, the tunneling barrier layer 130 may be arranged between semiconductor layer 110 and the conductive layer 120, for example, the first conductive layer 121. The electron affinity ($\chi_s$) of Si forming the semiconductor layer 110 may be −4.05 eV. When the tunneling barrier layer 130 is $TiO_2$, the conduction energy level ($E_{co}$) of $TiO_2$ may be −4.0 eV, which may be different from the electron affinity ($\chi_s$) of Si by only about 0.05 eV, and thus, the conduction band energy level and the electron affinity described above may be considered to be substantially identical to each other. Accordingly, the tunneling barrier layer 130 may expand the thickness of the Schottky barrier as indicated by WB' in FIG. 9 while hardly affecting the barrier height of the Schottky barrier between the first conductive layer 121 and the semiconductor layer 110. According to this, as tunneling of holes is reduced or prevented, the dark current may be reduced or prevented as indicated by ⑥ in FIG. 9.

In the state illustrated FIG. 9, when the visible light is incident onto the photodetector 100, light absorption may occur inside the semiconductor layer 110. When the energy (hv) of incident photon is greater than the bandgap energy ($E_g$) of Si as indicated by ④ in FIG. 9, electron-hole separation may occur in the semiconductor layer 110, and photocurrent may be detected.

As described above, holes may be majority charge carriers in this structure. When the tunneling barrier layer 130 is $TiO_2$, the valence band energy level ($E_{vo}$) of $TiO_2$ may be −7.2 eV, and in perspective of holes, the barrier height of the Schottky barrier may be very high. When the tunneling barrier layer 130 is $TiO_2$, the barrier height of the Schottky barrier in the perspective of holes may be obtained according to $\Phi'B=E_{go}-(\Phi_{Mi}-E_{co})$. As the barrier height of the Schottky barrier in the perspective of holes is bandgap $E_{go}$ of $TiO_2$=3.2 eV, when the first conductive layer 121 is Cu, 3.2 eV−(4.98−4.0 eV)=2.22 eV, and when the first conductive layer 121 is Ni, 3.2 eV−(5.04−4.0 eV)=2.16 eV. Accordingly, photocurrent may not be detected by incident light having lower energy, such as short wavelength infrared light. Instead, for example, when the first conductive layer 121 is Cu, photocurrent may be detected by incident light having energy higher than 2.22 eV, and when the first conductive layer 121 is Ni, photocurrent may be detected by incident light having energy higher than 2.16 eV, which correspond to visible light band. Accordingly, when the incident light is light of ultraviolet band, as indicated by ⑤ in FIG. 9, due to light energy absorbed by the first and second conductive layers 121 and 122, photocurrent by hot holes having energy higher than the barrier height (Φ'B) of the Schottky barrier may be detected.

Figure 10:
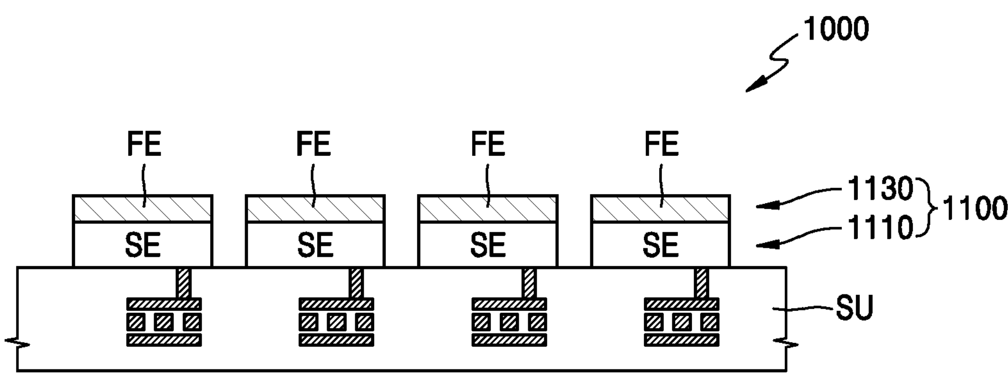
FIG. 10 is a schematic cross-sectional view of an image sensor according to an embodiment.
Figure 11:
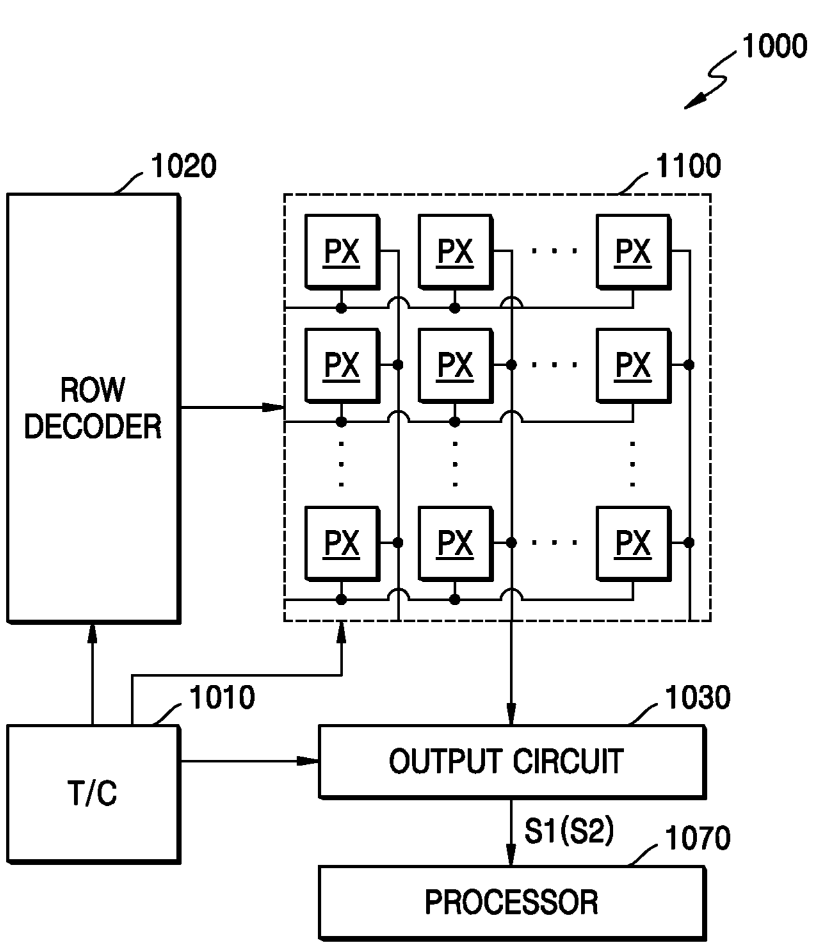
FIG. 11 is a block diagram illustrating a circuit configuration of the image sensor of FIG. 10, according to an embodiment.

FIG. 10 is a schematic cross-sectional view of an image sensor according to an embodiment, and FIG. 11 is a block diagram illustrating circuit configuration of the image sensor of FIG. 10. With reference to FIGS. 10 and 11, an image sensor 1000 may include a pixel array 1100 including a plurality of pixels PX. The pixel array 1100 may include a sensor array 1110 including a plurality of light-sensing elements SE. The photodetector 100 may be included in the light-sensing elements SE of the sensor array 1110. A separation film may be formed between adjacent light-sensing elements SE. A filter array 1130 including a plurality of filter elements FE respectively facing the plurality of light-sensing elements SE may be arranged on the sensor array 1110. The filter element FE may be a band-pass filter transmitting a certain wavelength band, and according to types of image to be obtained by the image sensor 1000, filter elements FE of proper wavelength band may be set. The filter element FE may be, for example, a band-pass filter for visible light band or a band-pass filter for infrared band. The filter array 1130 may include multiple types of filter elements FE for transmission of a plurality of wavelength bands which are different from each other. The filter array 1130 may be a general color filter. Hereinafter, the light-sensing elements SE and the filter elements FE arranged in correspondence to the light-sensing elements SE may be referred to as the pixels PX.

The image sensor 1000 may further include a circuit portion including circuit elements respectively connected to the plurality of light-sensing elements SE and reading a photoelectric signal generated at each of the plurality of light-sensing elements SE. At least a part of the circuit portion may be provided on a circuit board SU illustrated in FIG. 10, and the light-sensing elements SE may be arranged on the circuit board SU and may be connected to the circuit elements in the circuit board SU. The image sensor 1000 may include a pixel array 1100, a timing controller (T/C) 1010, a row decoder 1020, an output circuit 1030, and a processor 1070. The T/C 1010, the row decoder 1020, the output circuit 1030, the processor 1070 may be implemented in a single chip or separate chips.

The pixels PX of the pixel array 1100 may be arranged in a two-dimensional (2D) manner along a plurality of rows and columns. The row decoder 1020 may select one of the rows of the pixel array 1100 in response to a row address signal output from the T/C 1010. The output circuit 1030 may output a light sensing signal by the column from a plurality of pixels arranged along the selected row. In embodiments, the output circuit 1030 may include a column decoder and an analog-to-digital converter (ADC). For example, the output circuit 1030 may include a plurality of ADCs respectively arranged between the column decoder and the pixel array 1100 for each column, or an ADC arranged at an output terminal of the column decoder.

The processor 1070 may process an electrical signal from the output circuit 1030 and form an image. As the pixels PX provided in the image sensor 1000 according to an embodiment use, as the light-sensing elements SE, the photodetector 100 capable of sensing light in both visible light band and infrared band, the electrical signal from the output circuit 1030 may include a photoelectric signal S1 by the visible light and/or a photoelectric signal S2 by the infrared light. Accordingly, the processor 1070 may process such signals and form a visible light image and/or an infrared light image, and may also form a 3D image. For example, after a 2D image is formed from the photoelectric signal S1 by visible light, and depth information of each position of the 2D image is calculated from the photoelectric signal S2 by infrared light by using the time of flight (ToF) method, etc., a 3D image may be formed by combining the depth information with the 2D image. As the photodetector 100 senses light of ultraviolet band, the processor 1070 may form an ultraviolet image.

According to embodiments of photodetector described above, by increasing the thickness of the Schottky barrier, dark current caused by quantum mechanical tunneling by majority charge carriers having low energy may be reduced or prevented.

According to embodiments of photodetector described above, the photodetector may be driven with lower voltage, compared to some P-N junction structures, and may allow fast switching.

According to embodiments of photodetector described above, due to simpler manufacturing process, costs for mass production may be reduced, compared to some P-N junction structures.

The embodiments of photodetector described above may be applied to an image sensor which may deal with various wavelength bands.

The embodiments of photodetector may be readily used in silicon photonics.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A photodetector comprising:

a semiconductor layer;

a conductive layer comprising a first conductive layer forming a Schottky junction with the semiconductor layer, and second conductive layer on the first conductive layer; and a tunneling barrier layer between the semiconductor layer and the conductive layer, wherein the tunneling barrier layer is configured to block a dark current between the semiconductor layer and the conductive layer, and wherein the tunneling barrier layer comprises a metal oxide semiconductor material, wherein a work function of the first conductive layer is set such that a barrier height of a Schottky barrier corresponding to the Schottky junction is lower than a barrier height of a Schottky barrier corresponding to a Schottky junction that would be formed by the second conductive layer and the semiconductor layer without the first conductive layer.

2. The photodetector of claim 1, wherein the tunneling barrier layer is configured to increase a thickness of a Schottky barrier formed between the conductive layer and the semiconductor layer.

3. The photodetector of claim 1, wherein a difference between a conduction energy level of the tunneling barrier layer with respect to a vacuum level and an electron affinity of the semiconductor layer is less than or equal to 0.5 electron volts (eV).

4. The photodetector of claim 1, wherein a bandgap energy of the tunneling barrier layer is higher than a bandgap energy of the semiconductor layer.

5. The photodetector of claim 1, wherein a bandgap energy of the tunneling barrier layer is greater than or equal to 2 electron volts (eV).

6. The photodetector of claim 1, wherein a thickness of the tunneling barrier layer is less than or equal to 30 nanometers (nm).

7. The photodetector of claim 1, wherein the tunneling barrier layer comprises at least one of $TiO_2$, $SnO_2$, ZnO, $WO_3$, $Nb_2O_5$, $BaSnO_3$, $Zn_2SnO_4$, $SrTiO_3$, $BaTiO_3$, $Zn_2Ti_3O_8$, $Al_2O_3$, $HfO_2$, MgO, $MoO_3$, $Fe_2O_3$, $Ta_2O_3$, TaON, and $In_2O_3$.

8. The photodetector of claim 1, wherein the second conductive layer is configured to transmit light.

9. The photodetector of claim 8, wherein the semiconductor layer comprises a p-type semiconductor.

10. The photodetector of claim 9, wherein the photodetector is configured to sense visible light in a visible band and ultraviolet light in an ultraviolet band.

11. The photodetector of claim 8, wherein the first conductive layer comprises at least one of a metal, an alloy, a metal oxide, a metal nitride, and silicide.

12. The photodetector of claim 8, wherein the second conductive layer comprises at least one of ITO, IWO, IZO, GZO, GIZO, and AZO.

13. The photodetector of claim 1, wherein the semiconductor layer includes a n-type semiconductor, and the work function of the first conductive layer satisfies a following expression:

$$\Phi_M > \Phi_{Mi} > \chi_s,$$

where $\Phi_M$ represents the work function of the second conductive layer, $\Phi_{Mi}$ represents the work function of the first conductive layer, and $\chi_s$ represents an electron affinity of the semiconductor layer.

14. The photodetector of claim 13, wherein the photodetector is configured to sense visible light in a visible band and infrared light in an infrared band.

15. The photodetector of claim 1, wherein based on the semiconductor layer being an n-type semiconductor layer, the work function of the first conductive layer is lower than a work function of the second conductive layer, and wherein based on the semiconductor layer being a p-type semiconductor layer, the work function of the first conductive layer is higher than the work function of the second conductive layer.

16. An image sensor comprising:

a sensor array comprising a plurality of light-sensing elements, wherein each light-sensing element of the plurality of light-sensing elements comprises a photodetector; and a processor configured to decode a photoelectric signal generated at the each light-sensing element, wherein the photodetector comprises:

a semiconductor layer;

a conductive layer comprising a first conductive layer configured to form a Schottky junction with the semiconductor layer, and a second conductive layer on the first conductive layer; and a tunneling barrier layer arranged between the semiconductor layer and the conductive layer, wherein the tunneling barrier layer is configured to block a dark current between the semiconductor layer and the conductive layer, and wherein the tunneling barrier layer comprises a metal oxide semiconductor material, wherein a work function of the first conductive layer is set such that a barrier height of a Schottky barrier corresponding to the Schottky junction is lower than a barrier height of a Schottky barrier corresponding to a Schottky junction that would be formed by the second conductive layer and the semiconductor layer without the first conductive layer.

* * * * *